United States Patent
Tezuka et al.

(10) Patent No.: US 11,171,439 B2
(45) Date of Patent: Nov. 9, 2021

(54) CONNECTOR-EQUIPPED CASE, CONNECTOR-EQUIPPED WIRE HARNESS, AND ENGINE CONTROL UNIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Aya Tezuka, Yokkaichi (JP); Tatsuo Hirabayashi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/815,590

(22) Filed: Mar. 11, 2020

(65) Prior Publication Data

US 2020/0303867 A1 Sep. 24, 2020

(30) Foreign Application Priority Data

Mar. 22, 2019 (JP) .............................. JP2019-055701

(51) Int. Cl.
*H01R 13/518* (2006.01)
*B60R 16/02* (2006.01)
*H01R 13/50* (2006.01)

(52) U.S. Cl.
CPC ....... *H01R 13/518* (2013.01); *B60R 16/0215* (2013.01); *H01R 13/50* (2013.01);
(Continued)

(58) Field of Classification Search
CPC .. H01R 13/518; H01R 13/50; H01R 2201/26; B60R 16/0215; B60R 16/02; B60R 16/0207
See application file for complete search history.

(56) References Cited

U.S. PATENT DOCUMENTS 6,309,257 B1 * 10/2001 Huang ................... H05K 5/061
174/50.5
7,080,990 B1 * 7/2006 Juntwait .............. H01R 12/724
439/79

(Continued)

FOREIGN PATENT DOCUMENTS

JP 2017-004698 A 1/2017

OTHER PUBLICATIONS

"Aluminum-Silicon Alloys", Aug. 2003, Total Materia. http://www.totalmateria.com/Article80.htm, accessed Sep. 29, 2020 (Year: 2003).*

(Continued)

*Primary Examiner* — Abdullah A Riyami
*Assistant Examiner* — Justin M Kratt
(74) *Attorney, Agent, or Firm* — Oliff PLC

(57) ABSTRACT

A connector-equipped case that includes a case that includes a through hole; a connector fixed to the case, the connector including: a core that supports a plurality of terminals; and a hood that is formed by forming a region around the through hole of the case and a portion of the core in one piece; and an adhesive layer that is interposed between the case and the hood, wherein a constituent material of the adhesive layer is an adhesive that contains acrylic rubber.

11 Claims, 7 Drawing Sheets

(52) U.S. Cl.
CPC ........... *B60R 16/02* (2013.01); *B60R 16/0207* (2013.01); *H01R 2201/26* (2013.01)

(56) References Cited

U.S. PATENT DOCUMENTS

| | | | |
|---|---|---|---|
| 2012/0319513 A1* | 12/2012 | Okamoto | H02K 11/33 310/71 |
| 2015/0143694 A1* | 5/2015 | Lee | H05K 3/4682 29/846 |
| 2015/0267092 A1* | 9/2015 | Hill | C09J 4/06 428/463 |
| 2019/0025524 A1* | 1/2019 | Goto | B08B 7/0028 |
| 2019/0118739 A1* | 4/2019 | Takamatsu | H04L 12/66 |

OTHER PUBLICATIONS

"Aluminum-Silicon Alloys", Aug. 2003, Total Materia. http:/Avww.totalmateria.com/Article80.htm, accessed Sep. 29, 2020 (Year: 2003).*
"https://en.wikipedia.org/w/index.php?title=Chill_(casting)&oldid=87221331"; Dec. 14, 2020.
Stephen D Chastain; "Metal Casting: A Sand Casting Manual for the Small Foundry;" vol. 1; pp. 47-60; 2004.

\* cited by examiner

CONNECTOR-EQUIPPED CASE, CONNECTOR-EQUIPPED WIRE HARNESS, AND ENGINE CONTROL UNIT

BACKGROUND

The present disclosure relates to a connector-equipped case, a connector-equipped wire harness, and an engine control unit.

As an engine control unit for a vehicle, JP 2017-004698A discloses a structure including an enclosure made of metal that stores a circuit board, and a connector that is fixed to the enclosure using a silicone-based moisture-curable adhesive. The enclosure includes a case having a side surface opening, and a cover that covers an upper surface opening of the case. The connector includes multiple pin-shaped terminals and a housing made of resin that supports the terminals. An intermediate portion of the housing is interposed between the case and the cover in a state of being arranged in the side surface opening. As a result, a portion of the housing is arranged in the enclosure, and the remaining portion is arranged outside of the enclosure. A wire harness is connected to the above-described connector. A circuit board and an electronic device included in the engine are electrically connected to each other via the wire harness.

SUMMARY

It is desired that the size and weight of an engine control unit (ECU) including a wire harness are reduced.

Conventionally, an ECU that performs control of fuel injection and the like is arranged at a position located away from an engine, such as a corner of an engine room of an automobile. For this reason, a wire harness connecting the ECU and the engine is long. It was discovered that with an ECU having the above-described conventional structure, cracks may occur in the connector when the above-described ECU is arranged near the engine in order to shorten the wire harness. Due to the cracks occurring, the adhered state of the connector and the case may become unstable. Accordingly, it is desired that the state in which the connector and the case are bonded to each other can be maintained even in a usage environment that is subjected to a heat cycle, and furthermore, vibration.

In view of this, an exemplary aspect of the disclosure provides a connector-equipped case with excellent bondability with a connector portion and a case. Also, another exemplary aspect of the disclosure provides a connector-equipped wire harness and an engine control unit with excellent bondability with a connector portion and a case.

A connector-equipped case of the present disclosure includes: a case that includes a through hole; a connector fixed to the case, the connector including: a core that supports a plurality of terminals; and a hood that is formed by forming a region around the through hole of the case and a portion of the core in one piece; and an adhesive layer that is interposed between the case and the hood, wherein a constituent material of the adhesive layer is an adhesive that contains acrylic rubber.

A connector-equipped wire harness of the present disclosure includes: the connector-equipped case of the present disclosure; and a wire harness that is connected to ends of the terminals. The overall length of the wire harness is less than 800 mm.

A connector-equipped engine control unit of the present disclosure includes: the connector-equipped case of the present disclosure or the connector-equipped wire harness of the present disclosure; and the circuit board that is stored in the case and is connected to the ends on one side of the terminals.

The connector-equipped case of the present disclosure, the connector-equipped wire harness of the present disclosure, and the engine control unit of the present disclosure have excellent bondability with the connector portion and the case.

DETAILED DESCRIPTION OF EMBODIMENTS

Figure 1:
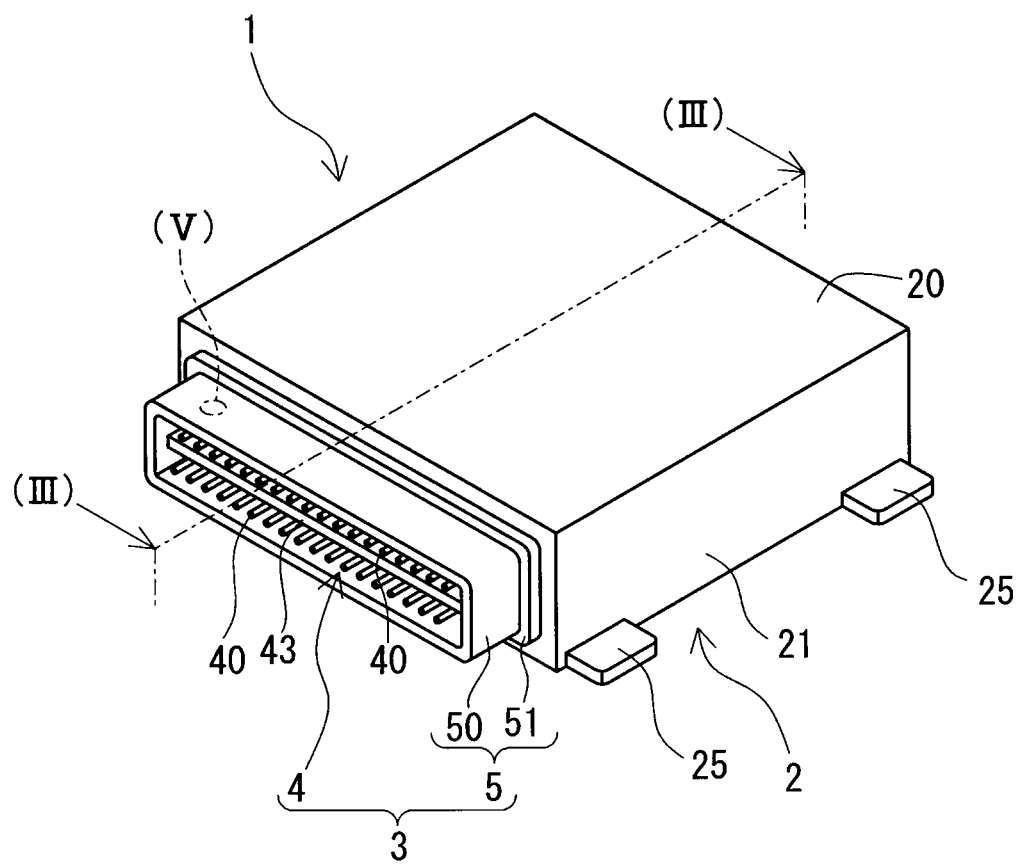
FIG. 1 is a schematic perspective view showing a connector-equipped case of an embodiment.

Description of Embodiments of the Present Disclosure

First, embodiments of the present disclosure will be listed and described.

(1) The connector-equipped case according to an aspect of the present disclosure includes:
a case; and
a connector portion fixed to the case.
The case includes a through hole,
the connector portion includes:
  a core portion that supports a plurality of terminals; and
  a hood portion that is formed by forming a region around the through hole of the case and a portion of the core portion in one piece,
the connector-equipped case further includes an adhesive layer that is interposed between the case and the hood portion, and
a constituent material of the adhesive layer is an adhesive containing acrylic rubber.

With the ECU of the above-described conventional structure, the housing of the connector is manufactured independently of the case of the enclosure. Also, the above-described conventional housing is manufactured using one instance of injection molding. In contrast to this, the connector-equipped case of the present disclosure includes two members, namely a core portion and a hood portion. Also, these two members are manufactured in a step-wise manner. Also, with the connector-equipped case of the present disclosure, the case includes a through hole, and the hood portion is provided in contact with the case in a region near the through hole of the case and is integrated with the core portion through the through hole. This connector-equipped case of the present disclosure is completely different from the above-described conventional structure.

Furthermore, with the connector-equipped case of the present disclosure, the constituent material of the adhesive layer interposed between the hood portion and the case is a specific adhesive containing acrylic rubber.

The above-described specific adhesive has excellent bondability with the constituent material of the hood portion, which is a thermoplastic resin such as polybutylene terephthalate (PBT). Also, the above-described specific adhesive has excellent bondability with metal. For example, even if the case is a die-cast member made of an aluminum-based alloy and has not been subjected to a surface treatment, the above-described specific adhesive has excellent bondability with the case. The connector-equipped case of the present disclosure, which includes an adhesive layer composed of this specific adhesive, has excellent bondability with the hood portion and the case, even in a usage environment that is subjected to a heat cycle (see later-described Test Example 1). Also, even if the connector-equipped case of the present disclosure is arranged in a usage environment that is repeatedly subjected to a heat cycle and vibration, such as a location near an engine, for example, a location directly above the engine, the hood portion and the case are not likely to separate from each other due to the above-described adhesive layer. Furthermore, the connector-equipped case of the present disclosure also has excellent sealability due to the above-described adhesive layer (see later-described Test Example 2).

If the hood portion is manufactured using injection molding, the above-described specific adhesive can be cured using the pressure and heat obtained during injection molding. For this reason, if the above-described specific adhesive is used, the adhesive layer can be formed and the hood portion and the case can be bonded to each other by the adhesive layer. This connector-equipped case of the present disclosure can reduce the number of steps, and has excellent manufacturability as well. If the above-described specific adhesive is in the form of a sheet, the adhesive can easily be arranged at a specific position on the case. Because of this, the connector-equipped case of the present disclosure has excellent manufacturability.

In addition, if the connector-equipped case of the present disclosure is arranged at a location near the engine, such as a location directly above the engine, the wire harness connected to the connector portion can be shortened compared to the case of being arranged in a corner or the like of the engine room. This is because an electronic device (e.g., a coil for a fuel injector, a spark plug, etc.) that is provided in the engine and to which the wire harness is connected is typically arranged above the engine. Due to shortening the wire harness, the connector-equipped case of the present disclosure contributes to a reduction in the size and weight of the engine control unit including the wire harness. If the connector-equipped case of the present disclosure is used in a control unit for a vehicle-mounted engine, the connector-equipped case contributes to a reduction in the size and weight of the vehicle-mounted components, and consequently, to an improvement in fuel efficiency.

(2) As one example of the connector-equipped case of the present disclosure, a mode is given in which
the glass-transition temperature of the adhesive is greater than −20° C. and less than 38° C.

In the above-described mode, acrylic rubber is suitably included, and therefore excellent bondability with the hood portion and the case is achieved.

(3) As one example of the connector-equipped case of the present disclosure, a mode is given in which
the thickness of the adhesive layer is 0.1 mm or more and 0.5 mm or less.

The above-described mode includes the adhesive layer that satisfies the above-described specific thickness, and therefore the bonded state of the hood portion and the case is favorably maintained, and excellent sealability is achieved by the adhesive layer.

(4) As one example of the connector-equipped case of the present disclosure, a mode is given in which
a constituent material of the hood portion is a resin composition containing polybutylene terephthalate and polyethylene terephthalate.

The hood portion composed of the above-described specific resin composition has excellent bondability with the adhesive layer composed of the above-described specific adhesive. Also, the above-described specific resin composition has excellent toughness. For this reason, the hood portion is not likely to warp. Due to this, the above-described mode has more excellent bondability with the hood portion and the case. Due to having excellent toughness, cracks are not likely to occur even if the above-described hood portion is provided in contact with a metal such as an aluminum-based alloy, and is arranged in a usage environment that is repeatedly subjected to a heat cycle and vibration, such as a location near an engine, for example, a location directly above the engine. Accordingly, the above-described mode can be suitably used in a case of being arranged at a location near an engine, such as a location directly above the engine.

(5) As one example of the connector-equipped case of the present disclosure, a mode is given in which
a chill layer is included on a region of a surface of the case where the adhesive layer is formed.

With the case having a surface including a chill layer, it can be said that a surface treatment for removing the chill layer has not been carried out in the manufacturing process. By omitting the above-described surface treatment, it is possible to reduce the number of steps, and the above-described mode has excellent manufacturability.

(6) As one example of the connector-equipped case of the present disclosure, a mode is given in which
the case is a die-cast member.

The case included in the above-described mode can be easily manufactured using die casting. The above-described mode has more excellent manufacturability since the case is easy to manufacture.

(7) As one example of the connector-equipped case according to (6) above, a mode is given in which
a constituent material of the case is an aluminum-based alloy.

In the above-described mode, the constituent material of the case is more lightweight compared to the case of using an iron-based alloy or the like, for example. Also, the case has an excellent heat transmission property. For this reason, heat is not likely to be trapped in the adhesive layer and the like. As a result, thermal denaturation and the like of the adhesive layer accompanying the heat cycle are reduced. Accordingly, the bondability with the hood portion and the case is favorably maintained.

(8) As one example of the connector-equipped case according to (7) above, a mode is given in which the aluminum-based alloy contains Si in an amount of 1 mass % or more and 30 mass % or less.

The thermal expansion coefficient of an aluminum-based alloy containing Si (silicon) tends to be small. For this reason, the difference between the thermal expansion coefficient of the case and the thermal expansion coefficient of the adhesive layer tends to be small. As a result, fracturing at the adhesion interfaces of the adhesive layer is suppressed. For this reason, the adhesive layer and the case are favorably bonded. This above-described mode has improved bondability with the hood portion and the case. Also, the case included in the above-described mode has excellent castability. The above-described mode has more excellent manufacturability since the case is easy to manufacture. Furthermore, in general, a chill layer exists on the surface of the die-cast member composed of the aluminum-based alloy containing Si. When resin is injection-molded in the die-cast member including the chill layer (when insert molding is performed), the chill layer hinders areal contact between the die-cast member and the resin molded body. In contrast to this, in the above-described mode, the hood portion and the case can be favorably bonded by the adhesive layer, even if a surface treatment such as removal of the chill layer is not performed as described above. Since the above-described surface treatment is not needed, the above-described mode has excellent manufacturability.

(9) As one example of the connector-equipped case of the present disclosure, a mode is given in which the case includes a fixing piece that is used for attachment to an engine.

The above-described mode has excellent attachment workability since the connector-equipped case is easily fixed to the engine.

(10) As one example of the connector-equipped case of the present disclosure, a mode is given in which the connector-equipped case is attached directly above the engine.

In the above-described mode, the length of the wire harness that is connected to the connector portion can be shortened. Accordingly, the above-described mode contributes to the reduction of the size and weight of the engine control unit including the wire harness.

(11) As one example of the connector-equipped case of the present disclosure, a mode is given in which a circuit board connected to ends on one side of the terminals performs control of at least one of fuel injection of the engine and ignition of the engine.

An injector that performs fuel injection for an engine and a spark plug of an engine are typically provided above the engine. For this reason, in the above-described mode, in particular, it is possible to reduce the length of the wire harness by arranging the connector-equipped case directly above the engine. Accordingly, the above-described mode contributes to the reduction of the size and weight of the engine control unit including the wire harness.

(12) As one example of the connector-equipped case according to any one of (9) to (11) above, a mode is given in which the engine is an engine of an automobile.

In the above-described mode, the length of the wire harness can be reduced due to the connector-equipped case being arranged at a location near the engine, such as a location directly above the engine, as described above. Accordingly, in the above-described mode, an engine control unit that is smaller and lighter in weight than the conventional structure can be constructed in a state including the wire harness. This mode contributes to an improvement in fuel efficiency.

(13) A connector-equipped wire harness according to an aspect of the present disclosure includes:

the connector-equipped case according to any one of (1) to (12) above; and a wire harness connected to end portions of the terminals. The overall length of the wire harness is less than 800 mm.

Since the overall length of the wire harness is less than 800 mm, the connector-equipped wire harness of the present disclosure need only be used arranged at a location near the engine, such as a location directly above the engine. Since the connector-equipped wire harness of the present disclosure includes the above-described connector-equipped case of the present disclosure, the bonded state between the hood portion and the case can be favorably maintained even if arranged near the engine.

(14) An engine control unit (ECU) according to an aspect of the present disclosure includes:

the connector-equipped case according to any one of (1) to (12) above or the connector-equipped wire harness according to (13) above; and the circuit board that is stored in the case and is connected to the ends on one side of the terminals.

Since the ECU of the present disclosure includes the connector-equipped case of the present disclosure or the connector-equipped wire harness of the present disclosure, it is possible to favorably maintain the bonded state between the hood portion and the case, even if the ECU is arranged at a location near the engine, such as a location directly above the engine. Also, since the wire harness can be shortened, or the wire harness is short, the ECU of the present disclosure is smaller and lighter in weight than the above-described conventional structure.

DETAILED EMBODIMENTS OF THE PRESENT DISCLOSURE

Hereinafter, embodiments of the present disclosure will be described specifically with reference to the drawings. Identical reference numerals in the drawings indicate items with identical names.

1. Embodiment

Structures of a connector-equipped case 1, a connector-equipped wire harness 10, and an engine control unit (ECU) 17 of an embodiment will be described mainly with reference to FIGS. 1 to 4. Thereafter, the materials of the constituent components of the connector-equipped case 1 of the embodiment will be described in detail.

Figure 2:
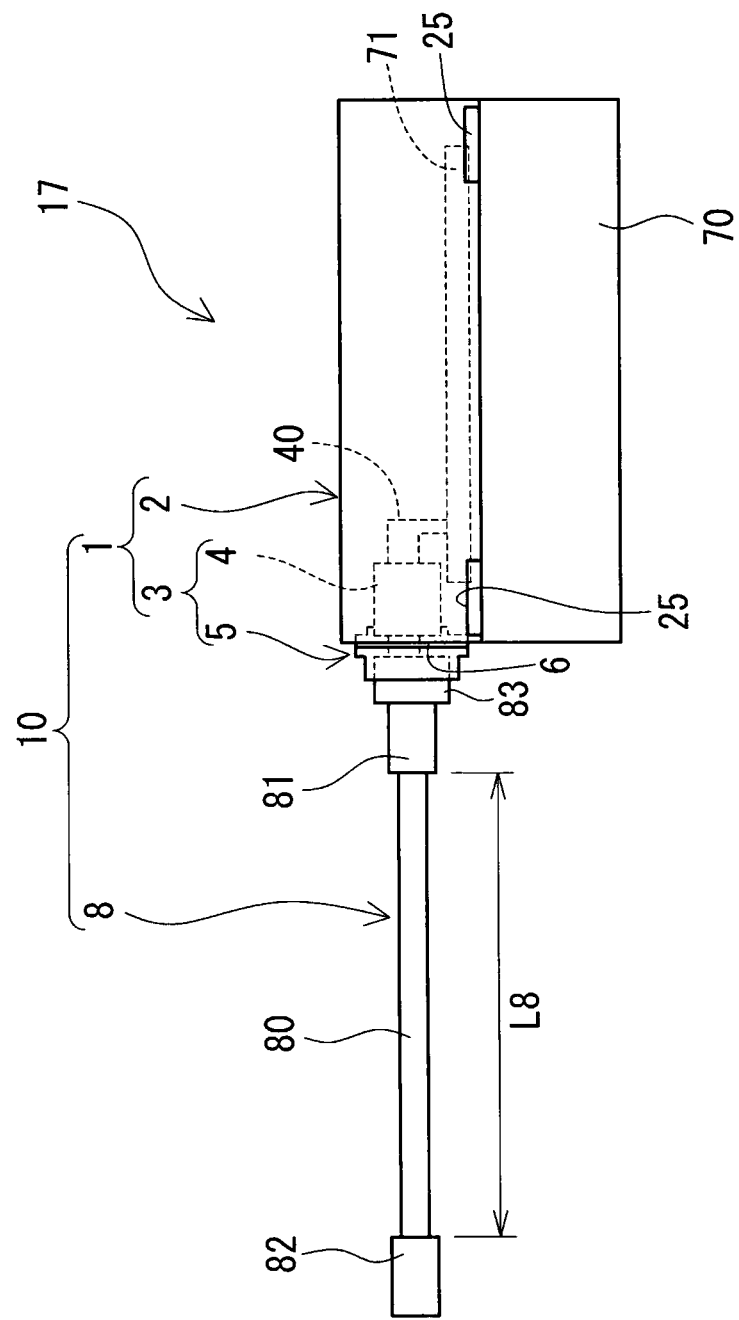
FIG. 2 is a schematic side view showing a connector-equipped wire harness and an engine control unit of an embodiment.
Figure 3:
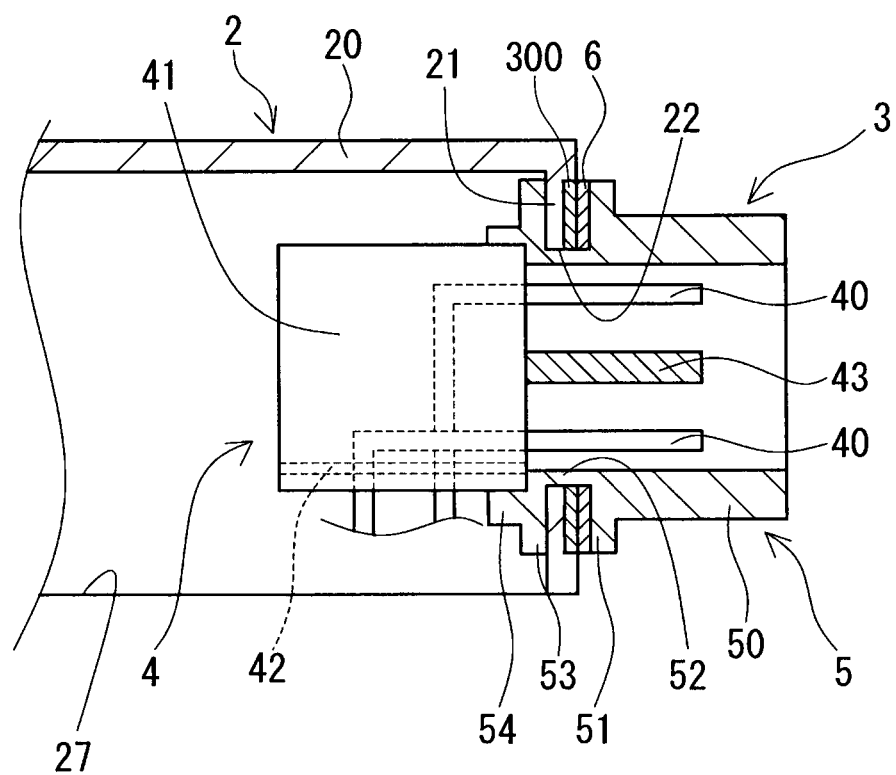
FIG. 3 is a partial cross-sectional view showing a state in which the connector-equipped case of the embodiment shown in FIG. 1 has been cut along cutting line (III)-(III).
Figure 4:
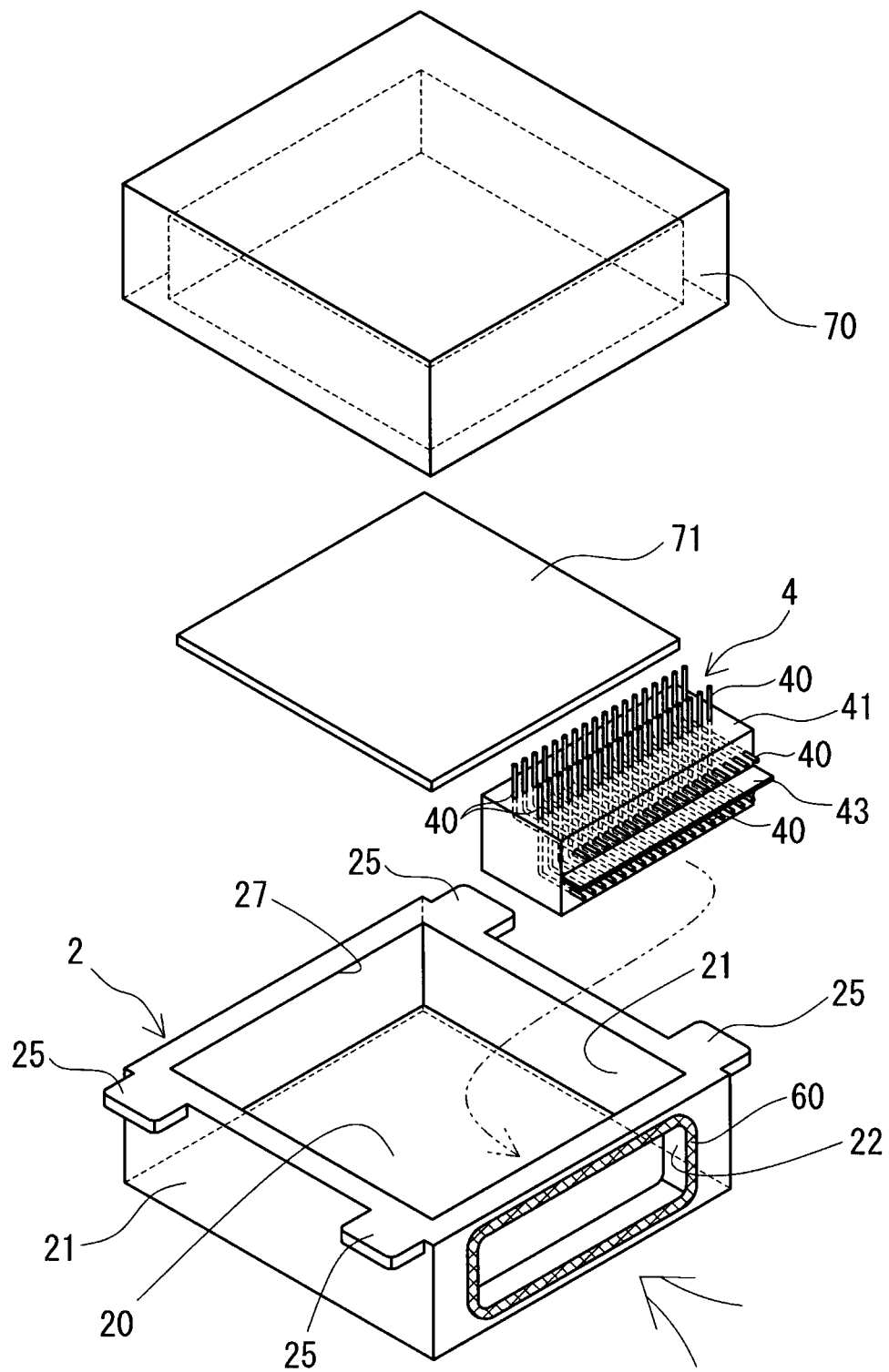
FIG. 4 is an exploded perspective view illustrating a method for manufacturing the connector-equipped case of the embodiment.

FIGS. 1 to 3 show a state in which a case 2 is arranged such that an opening portion 27 of the case 2 faces downward. FIG. 4 shows a state in which the case 2 is arranged such that the opening portion 27 of the case 2 faces upward.

FIG. 3 mainly shows cross-sections of the case 2 and the hood portion 5, and shows the external appearance of a main body portion 41 of the core portion 4.

1-1. Overview

The connector-equipped case 1 of the embodiment includes the case 2 and a connector portion 3 (connector) that is fixed to the case 2 (FIG. 1). The case 2 is a container-shaped member having the opening 27 (FIG. 4), and is made of metal. The cover 70 is attached so as to cover the opening portion 27 of the case 2 (FIGS. 2 and 4). A circuit board 71 is stored in an internal space of the case 2 and the cover 70 (FIG. 2). The connector portion 3 includes multiple terminals 40. These terminals 40 electrically connect the circuit board 71 in the case 2 and an external device (e.g., the wire harness 8) outside of the case 2 to each other. The circuit board 71 includes a circuit that controls an electronic device such as the engine, for example. This connector-equipped case 1 stores the cover 70 and the circuit board 71 as described above, and is used as a constituent component of a control unit such as the ECU 17.

The connector-equipped case 1 of the embodiment differs from the above-described conventional structure in which the connector is interposed between the case and the cover. Specifically, the case 2 has a through hole 22 (FIGS. 3 and 4). The connector portion 3 is inserted through the through hole 22 of the case 2 (FIGS. 2 and 3). Also, the connector unit 3 includes a portion arranged inside of the case 2 and a portion arranged outside of the case 2. Both portions are supported in one piece by the case 2 (FIGS. 2 and 3). Specifically, the connector portion 3 includes a core portion 4 (core) and a hood portion 5 (hood). The core portion 4 is a resin molded body that supports the multiple terminals 40 (see also FIG. 4). The core portion 4 is arranged mainly in the case 2. The hood portion 5 is a resin molded body formed by molding the region around the through hole 22 of the case 2 and a portion of the core portion 4 in one piece (FIG. 3). The hood portion 5 is mainly arranged outside of the case 2. The "region around the through hole 22 of the case 2" in this context includes the peripheral edge of the through hole 22 on the outer peripheral surface of the case 2 and a ring-shaped region surrounding the peripheral edge (see the region denoted by cross-hatching in FIG. 4), the inner peripheral space of the through hole 22, the peripheral edge of the through hole 22 on the inner peripheral surface of the case 2, and a ring-shaped region including the peripheral edge.

In particular, the connector-equipped case 1 of the embodiment includes an adhesive layer 6 that is interposed between the case 2 and the hood portion 5. The constituent material of the adhesive layer 6 is an adhesive containing non-diene-based rubber and an amino silane coupling agent. The adhesive layer 6, which is composed of the above-described specific adhesive, has excellent bondability with the case 2, which is composed of a metal such as an aluminum-based alloy, and with the hood portion 5, which is composed of a resin such as polybutylene terephthalate (PBT). The connector-equipped case 1 of the embodiment including this adhesive layer 6 can be used by being attached in a usage environment that is repeatedly subjected to a heat cycle, such as a location near an engine, for example, a location directly above an engine.

1-2. Connector-Equipped Case 1-2-1. Case

As illustrated in FIG. 4, examples of the case 2 include a box-shaped container that includes a bottom portion 20 and a frame-shaped side wall 21 that is provided in a standing manner on the bottom portion 20, the side of the container opposing the bottom portion 20 being open. The inner space of the case 2 is used as a storage space for predetermined stored items, such as a portion of the connector portion 3 (a portion of the hood portion 5 and the core portion 4) and the circuit board 71 here. Although a cuboid case 2 is illustrated in FIG. 1, the shape and size of the case 2 and the shape and size of the later-described cover 70 may be adjusted according to the shape and size of the above-described stored objects.

In a portion of the side wall 21, the case 2 includes a through hole 22 that passes through the case 2. Due to the inner circumferential surface of the through hole 22 holding the intermediate portion of the connector portion 3 (FIG. 3), one end portion of the connector portion 3 is stored in the case 2 and the other end portion of the connector portion 3 is exposed (protrudes) to the outside of the case 2.

The shape, size, and number of the through hole 22 may be adjusted according to the shape, size, and number of the connector portion 3. Although the case 2 of the present example includes one rectangular through hole 22, the case 2 may also include multiple through holes 22.

In addition, if the case 2 includes a fixing piece 25 that is used for attachment to an installation target, it is easier to perform fixing to the installation target, and excellent attachment workability is achieved. Examples of the above-described installation target typically include an engine, such as an engine of an automobile. FIG. 4 illustrates a case in which tongue-shaped members that protrude outward from the four corners of the cuboid case 2 are fixing pieces 25. The shape, size, number, forming positions, and the like of the fixing pieces 25 can be changed as appropriate.

Examples of the case 2 include a die-cast member. If die casting is used, the box-shaped case 2 that is formed due to the bottom portion 20 and the side wall 21 being molded in one piece can be easily manufactured. The connector-equipped case 1 has excellent manufacturability due to the box-shaped case 2 being easy to manufacture. Also, if the bottom portion 20 and the side wall 21 are an integrally-molded member, the case 2 also has excellent sealability. If the later-described cover 70 is also a die-cast member, the cover 70 can also be manufactured easily and has excellent sealability. Note that the case 2 and the cover 70 may also be a member other than a die-cast member (e.g., a plastic processed member subjected to deep drawing or the like).

1-2-2. Cover

Examples of the cover 70 typically include a box-shaped container, similarly to the case 2. Note that with the connector-equipped case 1 and the connector-equipped wire harness 10 of the embodiment, in a state prior to storing the circuit board 71, the cover 70 is not included, and the case 2 is open.

The case 2 and the cover 70 are easily attached when flange portions (not shown) that are extended outward from the opening edges are included therein. If an adhesive (not shown) is interposed between the flange portion of the case 2 and the flange portion of the cover 70, the sealability is improved.

1-2-3. Connector Portion 1-2-3-1. Terminals

The terminals 40 are typically rod-shaped (pin-shaped) members constituted by a conductive material such as copper or a copper alloy. The terminals 40 include connection ends (ends on one side) for connecting with the circuit board 71, and connection ends (ends on another side) for connecting with an external device. As illustrated in FIG. 4, the multiple terminals 40 are arranged side by side on one line at a predetermined interval, and this group of terminals is further aligned in multiple levels. Also, the terminals 40 are bent as appropriate such that the end portions face a predetermined direction. The multiple terminals 40 are supported by the core portion 4 (main body portion 41) such that the above-described aligned and bent state is maintained and connection to the circuit board 71 and the external device is possible. The number, alignment, bent state, and the like of the terminals 40 can be changed as appropriate.

In the connector-equipped case 1, the connection ends (ends on the one side) of the terminals 40 that are connected to the circuit board 71 are arranged inside of the case 2. The connection ends (ends on the other side) of the terminals 40 that are connected to the external device are arranged so as to face the outside of the case 2 via the through hole 22 of the case 2. Typically, as shown in FIGS. 1 and 3, the intermediate portions of the terminals 40 are inserted through the through hole 22 and the ends on the other sides of the terminals 40 are arranged outside of the case 2.

1-2-3-2. Core Portion

The core portion 4 is a member that holds the intermediate portions of the multiple terminals 40 and supports the end portions on both sides of the terminals 40 in an exposed state (FIGS. 3 and 4). The core portion 4 of the present example includes a support plate 42 (FIG. 3) to which the terminals 40 are fixed through press-fitting, a main body portion 41, and a partition portion 43. The main body portion 41 is a member that supports at least a portion of the peripheral edge portion of the support plate 42. Due to the main body portion 41 being arranged at a predetermined position on the case 2, the end portions of the terminals 40 held in the support plate 42 are arranged in a predetermined orientation. FIG. 3 illustrates a state in which the support plate 42 is arranged in the case 2 such that the front and rear surfaces of the support plate 42 are parallel with the axial direction of the through hole 22. Note that in FIGS. 2 and 4, the main body portion 41 and the support plate 42 are simplified and are indicated by cuboids. The partition portion 43 is a flat plate-shaped member that protrudes from the outer circumferential surface of the main body portion 41. The partition portion 43 is interposed between adjacent terminal groups (FIG. 1) and increases the electrical insulation between the terminal groups. For example, the core portion 4 is manufactured by being injection-molded (insert-molded) in the plate member to which the above-described terminals 40 are fixed.

The shape, size, and the like of the core portion 4 may be adjusted as appropriate according to the number, alignment state, and the like of the terminals 40. Also, although a case is indicated in which the connector-equipped case 1 of the present example includes one core portion 4, the connector-equipped case 1 may also include multiple core portions 4.

1-2-3-3. Hood Portion

The hood portion 5 is a member that is integrated with the core portion 4 and forms the connector portion 3 along with the core portion 4. The hood portion 5 includes a portion arranged outside of the case 2. The portion of the hood portion 5 arranged outside of the case 2 includes a function of mechanically protecting the connection ends of the multiple terminals 40 that are connected to the external device, a function of guiding the external device to the connection ends when connecting the terminals 40 and the external device, and the like. The hood portion 5 is, for example, manufactured by performing injection molding (insert molding) in the case 2 and the core portion 4.

The hood portion 5 of the present example is an integrally molded object that includes a main body portion 50, an outer flange portion 51, an insertion portion 52, an inner flange portion 53, and a joining portion 54 (FIG. 3), and in which these portions are continuous with each other. Also, the hood portion 5 of the present example is an overall tube-shaped member that conforms to the inner peripheral shape of the through hole 22 (FIG. 1). The main body portion 50 and the outer flange portion 51 are arranged outside of the case 2 (FIGS. 1 and 3). The insertion portion 52 is arranged in contact with the inner peripheral surface of the through hole 22 (FIG. 3). The inner flange portion 53 and the joining portion 54 are arranged inside of the case 2 (FIG. 3).

The main body portion 50 of the present example is a tube-shaped portion that surrounds the connection ends of the terminals 40 that are connected to the external device. The main body portion 50 is provided so as to protrude in the axial direction of the through hole 22 from a ring-shaped region that surrounds the peripheral edge of the through hole 22 on the outer peripheral surface of the case 2. The main body portion 50 contributes to mechanical protection and protection from the environment of the end portions of the above-described terminals 40, improvement in electrical insulation between the surrounding member and the terminals 40 in the case where the connector-equipped case 1 is installed, improvement in the connection workability of the external device, and the like.

The outer flange portion 51 is a ring-shaped portion that is extended in a direction intersecting the axial direction of the main body portion 50 (substantially matches the axial direction of the through holes 22 in the present example) from the peripheral edge of the main body portion 50. The outer flange portion 51 is arranged in contact with the ring-shaped region surrounding the peripheral edge of the through holes 22 on the outer peripheral surface of the case 2. The hood portion 5 including the outer flange portion 51 can increase the bonding area between the case 2 and the adhesive layer 6 and can be favorably integrated with the case 2. The sealability is also improved due to the increase in the surface area of the hood portion 5. The size of the outer flange portion 51 and the size of the later-described inner flange portion 53 may be adjusted according to the size of the through hole 22.

The insertion portion 52 is provided so as to fill in the region on the inner peripheral surface side of the inner peripheral space of the through hole 22. Also, the insertion portion 52 integrates the portion of the hood portion 5 that is arranged outside of the case 2, and the portion of the hood portion 5 that is located inside of the case 2. In the present example, an inner space is formed in which three portions, namely the insertion portion 52, the above-described outer flange portion 51, and the main body portion 50 are continuous with each other. The thicknesses and the like of the above-described three portions are adjusted such that the above-described inner space has a uniform size in the axial direction of the main body portion 50, the size being such that no contact is made with the terminals 40 (FIG. 3).

The inner flange portion 53 is a ring-shaped portion that is extended in a direction perpendicular to the axial direction of the main body portion 50 from the peripheral edge of the insertion portion 52. The inner flange portion 53 is arranged in contact with a ring-shaped region surrounding the peripheral edge of the through hole 22 on the inner peripheral surface of the case 2. Also, the inner flange portion 53 and the above-described outer flange portion 51 are provided so as to sandwich the side wall 21 of the case 2 (FIG. 3). Due to this, the hood portion 5 can be strongly integrated with the case 2, and the sealability is also further improved.

The joining portion 54 is a portion that integrates the core portion 4 and the hood portion 5 (FIG. 3). The joining portion 54 of the present example is provided in a ring shape so as to cover a location that is a portion of the core portion 4 and does not interfere with the terminals 40. The shape and size of the joining portion 54 may be adjusted as appropriate according to the shape and size of the core portion 4.

1-2-4. Adhesive Layer

The adhesive layer 6 is interposed between the case 2 and the hood portion 5 of the connector portion 3 (FIGS. 2 and 3). The adhesive layer 6 improves the bondability with the case 2 and the hood portion 5 and improves the sealability as well. The connector-equipped case 1 of the present example includes the adhesive layer 6 between a ring-shaped region surrounding the peripheral edge of the through hole 22 on the outer peripheral surface of the case 2 (refer to the region indicated by cross-hatching in FIG. 4) and the outer flange portion 51.

1-3. Connector-Equipped Wire Harness

The connector-equipped wire harness 10 of the embodiment includes: a connector-equipped case 1 of the embodiment and a wire harness 8 that is connected to the end portions (ends on the other side) of the terminals 40 of the connector portion 3 (FIG. 2). The ends on one side of the terminals 40 are connected to the circuit board 71. One end of the wire harness 8 is electrically connected to the circuit board 71 via the terminals 40. The other end of the wire harness 8 is electrically connected to the electronic device controlled by the circuit board 71.

1-3-1. Wire Harness

The wire harness 8 includes: one or more wires 80; and connectors 81 and 82 that are attached to the end portions of the wires 80. The wires 80 include conductors and electrical insulation layers. The conductors are typically constituted by a conductive material such as copper, aluminum, or an alloy thereof. The electrical insulation layer is constituted by an electrical insulating material such as resin and covers the external periphery of the conductor. FIG. 2 illustrates a case in which one wire 80 is included, but the wire harness 8 may also include multiple wires 80. An appropriate male connector or female connector can be used as the connectors 81 and 82.

As illustrated in FIG. 2, the connector 83 (e.g., female connector) may also separately be interposed between the connector 81 (e.g., a male connector) of the wire harness 8 and a connector portion 3 (e.g., a male connector) of the connector-equipped case 1.

The overall length L8 (here, the overall length of the wire 80 excluding the connectors 81 and 82) of the wire harness 8 may be adjusted as appropriate according to the distance from the circuit board 71 to the electronic device. Examples of the connector-equipped wire harness 10 include a mode in which the overall length L8 of the wire harness 8 is less than 800 mm. The shorter the above-described overall length L8 is, the smaller the size and the lighter the weight of the ECU 17 including the wire harness 8 can be made. For this reason, the above-described overall length L8 may be 700 mm or less, or furthermore 500 mm or less, 300 mm or less, or 250 mm or less.

The mode in which the above-described overall length L8 is less than 800 mm can be used when the distance from the circuit board 71 to the electronic device is short. For example, if the circuit board 71 controls the electronic device of the engine, the connector-equipped wire harness 10 is arranged at a location near the engine, such as a location directly above the engine. In this case, the circuit board 71 can control an electronic device provided above the engine, such as an injector coil for performing fuel injection, a spark plug, and the like.

1-4. Engine Control Unit (ECU)

The ECU 17 of the embodiment includes: the connector-equipped case 1 of the embodiment or the connector-equipped wire harness 10 of the embodiment, and the circuit board 71 that is stored in the case 2 and is connected to the ends on one side of the terminals 40 (FIG. 2). Typically, the ECU 17 includes the cover 70 and stores the circuit board 71 with the case 2 and the cover 70. The circuit board 71 is connected to the electronic device of the engine via the wire harness 8 connected to the ends on the other side of the terminals 40. Due to this connection, the above-described electronic device performs predetermined control using the circuit board 71.

If the circuit board 71 performs control of at least one of the fuel injection of the engine and the ignition of the engine, the ECU 17 can be arranged directly above the engine, as described above. In this case, the overall length L8 of the wire harness 8 can be made shorter.

1-5. Constituent Materials 1-5-1. Adhesive Layer

The constituent material of the adhesive layer 6 is an adhesive containing acrylic rubber. The specific adhesive has excellent bondability with metal, such as an aluminum-based alloy, and has excellent bondability with resin such as PBT. For this reason, even if the case 2 and the hood portion 5 that are bonded together by the adhesive layer 6 composed of the above-described specific adhesive are subjected to a heat cycle during use, and are furthermore repeatedly subjected to a heat cycle and vibration, the bonded state can be favorably maintained. Even if arranged at a location near the engine, such as a location directly above the engine, for example, the adhesive layer 6 maintains the bonded state between the case 2 and hood portion 5, and the case 2 and the hood portion 5 are less likely to separate. Also, the above-described specific adhesive has excellent sealability. For this reason, the connector-equipped case 1 and the connector-equipped wire harness 10 including the adhesive layer 6 composed of the above-described specific adhesive can construct an ECU 17 with excellent sealability.

Furthermore, the above-described specific adhesive also contributes to improving the manufacturability of the connector-equipped case 1 in the following respects.

(1) The above-described specific adhesive can strongly adhere the case 2 and the hood portion 5, even if a surface treatment such as removing a chill layer is not performed when the case 2 is a die-cast member composed of an Al-based alloy containing Si. For this reason, the above-described surface treatment is not needed.

(2) The above-described specific adhesive can be cured through pressure and heat obtained during injection molding. For this reason, the molding of the hood portion 5, the curing of the adhesive layer 6, and the bonding of the case 2 and the hood portion 5 can be performed simultaneously during injection molding. Accordingly, no independent curing step is needed.

(3) The above-described specific adhesive can be molded in the form of a sheet. For this reason, the adhesive in the form of a sheet can be easily arranged at a predetermined position on the case 2. Also, the thickness of the adhesive layer 6 can be easily adjusted. Furthermore, the adhesive in the form of a sheet is easy to store and manage.

The glass-transition temperature of the above-described specific adhesive may be, for example, greater than −20° C. and less than 38° C. The glass-transition temperature is likely to influence the flexibility in the low-temperature range (e.g., about room temperature) in particular, and the adhesive strength of the interface between the adhesive and the bonding target. If the glass-transition temperature is low, the flexibility in the low-temperature range tends to be excellent, but the above-described adhesive strength of the interface is likely to decrease. If the glass-transition temperature is high, the adhesive strength of the interface tends to be high, but the flexibility in the low-temperature range is likely to decrease. It can be said that an adhesive having a glass-transition temperature that falls within the above-described range suitably contains acrylic rubber. In this adhesive, there is a good balance between favorable flexibility in the low-temperature range and favorable adhesive strength of the above-described interface. For this reason, the adhesive layer 6 composed of this adhesive can favorably bond the case 2 and the hood portion 5. The blending of the acrylic rubber may be adjusted such that the glass-transition temperature falls within the above-described range. If the glass-transition temperature is −15° C. or more and 30° C. or less, and furthermore 20° C. or less, and 0° C. or less, more excellent bondability is achieved, which is preferable.

The thickness of the adhesive layer 6 is, for example, 0.1 mm or more and 0.5 mm or less. If the above-described thickness is 0.1 mm or more, the case 2 and the hood portion 5 can maintain the bonded state due to the adhesive layer 6, and excellent sealability is achieved. If the above-described thickness is 0.5 mm or less, a reduction in sealability caused by deformation due to the adhesive layer 6 being too thick is prevented, and favorable sealability is likely to be maintained. The above-described thickness may also be 0.15 mm or more and 0.45 mm or less, or furthermore 0.40 mm or less, 0.35 mm or less, or 0.30 mm or less.

1-5-2. Resin Composition

The resin composition constituting the core portion 4 and the hood portion 5 contains, for example, a thermoplastic resin such as PBT. In particular, a resin composition containing the thermoplastic resin in an amount of more than 50 mass % with respect to 100 mass % of the resin composition, that is, a resin composition that mainly contains thermoplastic resin, has an excellent injection molding property. For this reason, if the above-described resin composition is used, the core portion 4 and the hood portion 5 can be easily manufactured. The material constituting the core portion 4 and the hood portion 5 may also be a known resin composition.

The constituent material of the core portion 4 and the constituent material of the hood portion 5 may be substantially the same. In this case, a state in which both the core portion 4 and the hood portion 5 are integrated is favorably maintained. This is because in both the core portion 4 and the hood portion 5, properties such as the thermal expansion coefficient are substantially equal, and therefore the thermal expansion states are likely to be equal even if subjected to a heat cycle. Also, if the hood portion 5 is manufactured through injection molding, both the core portion 4 and the hood portion 5 are favorably bonded using the heat during injection molding, or the like. Due to this reason as well, the state in which both the core portion 4 and the hood portion 5 are integrated is favorably maintained. Furthermore, during injection molding, the molding of the hood portion 5 and the integration of the hood portion 5 and the core portion 4 can be performed simultaneously. In this respect, this mode also has excellent manufacturability. Note that the constituent material of the core portion 4 and the constituent material of the hood portion 5 may also be different.

In particular, examples of the resin composition constituting the hood portion 5 include a resin composition containing PBT and polyethylene terephthalate (PET). The resin composition containing PBT and PET has excellent adherence with the adhesive 6 composed of the above-described specific adhesive. Also, the above-described resin composition has excellent toughness compared to the case of not containing PET. For this reason, the above-described resin composition is not likely to warp, even if it is provided in contact with a metal such as an aluminum-based alloy. Furthermore, cracks are not likely to occur in the above-described resin composition, even in a usage environment in which the above-described resin composition is provided in contact with the above-described metal and repeatedly subjected to a heat cycle. If this kind of resin composition is the constituent material of the hood portion 5, the bonded state between the hood portion 5 and the case 2 made of metal is favorably maintained by the adhesive layer 6, even if the resin composition is arranged near the engine. As a result, the sealability is also improved. Also, due to cracks not being likely to occur in the hood portion 5, the above-described bonded state is favorably maintained. The resin composition containing PBT and PET can be used also as the constituent material of the core portion 4.

The resin composition containing PBT and PET has an excellent injection molding property when the maximum amount of PBT is contained, and the hood portion 5 and the like are easy to manufacture. For example, the content of the PBT in the above-described resin composition may be 150 parts by mass or more and 400 parts by mass or less, relative to 100 parts by mass of PET. The resin composition in which the content of the PBT is in the above-described range has an effect of reducing the occurrence of cracks and an effect of reducing warping due to an improvement in toughness, and has favorable injection molding properties.

The resin composition containing PBT and PET may also further contain a filler. Examples of the filler include at least one of glass fibers and glass flakes. The glass fibers are elongated needle-like glass materials that contribute to improvement in the strength of the above-described resin composition. The glass flakes are flake-shaped glass materials that contribute to reduction of warping by reducing anisotropy relating to thermal expansion and contraction of the above-described resin composition. The content of the above-described filler may be 20 parts by mass or more and 60 parts by mass or less, relative to 100 parts by mass of the above-described resin composition. The resin composition in which the above-described content is in the above-described range has an effect of improving the strength and an effect of reducing warping, and is likely to maintain a favorable injection molding property. If both the glass fibers and the glass flakes are included, the mass ratio thereof is, for example, glass fibers glass flakes=6 to 8:4 to 2.

The resin composition containing PBT and PET may also further contain an elastomer. By including an elastomer, the toughness is further improved, and the hood portion 5 and the like are less likely to warp. The content of the elastomer may be 1 part by mass or more and 50 parts by mass or less, relative to 100 parts by mass of the above-described resin composition. Also, the resin composition containing PBT and PET may also contain an additive that increases hydrolysis resistance, such as epoxy resin or carbodiimide. The content of the epoxy resin and the like may be 1 part by mass or more and 20 parts by mass or less, relative to 100 parts by mass of the above-described resin composition.

Figure 5:
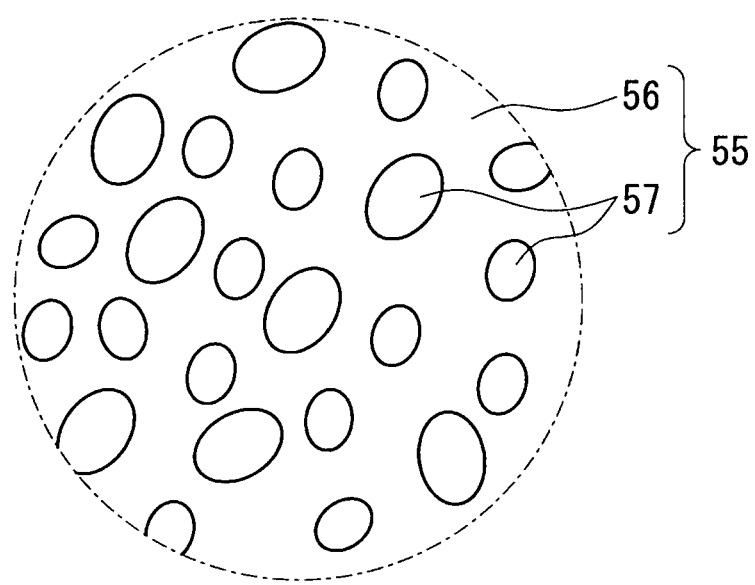
FIG. 5 is a schematic view showing an enlarged view of a location provided with a one-dot chain line circle (V) in the connector-equipped case of the embodiment shown in FIG. 1.

Also, the phase structure of a resin composition 55 containing PBT and PET is a sea-island structure as shown in FIG. 5, with a sea portion 56 mainly containing the PBT, and island portions 57 mainly containing the PET. In this case, cracks are less likely to occur, and warping is not likely to occur. This is because the PET is evenly dispersed in the PBT. Here, the "sea portion 56 mainly containing the PBT" means that with respect to 100 mass % of the constituent components of the sea portion 56, PBT makes up 80 mass % or more of the sea portion 56. The "island portions 57 mainly containing the PET" in this context means that with respect to 100 mass % of the constituent components of the island portions 57, PET makes up 80 mass % or more of the island portions 57. In the above-described sea-island structure, for example, the melted resin composition is sufficiently mixed such that the PET is evenly dispersed in the PBT in the manufacturing step.

1-5-3. Case

The constituent material of the case 2 is a metal, for example. An aluminum-based alloy (hereinafter called an Al-based alloy) is an example of a metal. The "Al-based alloy" in this context refers to an alloy that contains added elements, the remaining portion being composed of Al and inevitable impurities, with respect to 100 mass % of the Al-based alloy. The content of Al is more than 50 mass %, or is furthermore 60 mass % or more or 70 mass % or more. The Al-based alloy is lighter in weight compared to an iron-based alloy or the like. For this reason, the case 2 composed of the Al-based alloy is lightweight and contributes to reducing the weight of the connector-equipped case 1. Also, the Al-based alloy has excellent thermal conductivity compared to an iron-based alloy or the like. For this reason, the case 2 composed of the Al-based alloy has excellent thermal conductivity. The connector portion 3 and the adhesive layer 6 provided in contact with this case 2 easily dissipate heat to the case 2 and are not likely to trap heat. Accordingly, the connector-equipped case 1 including the case 2 composed of the Al-based alloy can reduce thermal denaturation and the like of the adhesive layer 6 accompanying the heat cycle, and can favorably maintain the bonded state between the case 2 and the hood portion 5. A known composition can be used as the Al-based alloy.

Examples of the Al-based alloy include an Al-based alloy that contains Si in an amount of 1 mass % or more and 30 mass % or less as the additional element. Due to the thermal expansion coefficient of the Al-based alloy containing Si in the above-described range being relatively small, the difference between the thermal expansion coefficient of the Al-based alloy and the thermal expansion coefficient of the above-described specific adhesive is likely to decrease. For this reason, the adhesive layer 6 composed of the above-described specific adhesive is likely to suppress a case in which fracturing (separation) occurs at the adhesion interface with the case 2 composed of the above-described Al-based alloy. As a result, the case 2 and the hood portion 5 can favorably maintain the bonded state due to the above-described adhesive layer 6. Also, the above-described Al-based alloy has excellent castability (mold-release property), and therefore the case 2 is easily manufactured using die casting. The connector-equipped case 1 has more excellent manufacturability due to the case 2 being easy to manufacture. Examples of the Al-based alloy containing Si in the above-described range include ADC1, ADC3, ADC10, ADC12, and ADC14, which are defined in JIS H 5302 (2006).

Here, the die-cast member composed of the Al-based alloy containing Si in the above-described range generally includes a chill layer 300 on its surface. The chill layer improves the mold-release property. However, if the resin is injection-molded in a die-cast member having the chill layer 300, the above-described die-cast member and the resin molded body are not likely to stick to each other. For this reason, if the resin is injection-molded in the above-described die-cast member, it is desirable to implement a surface treatment (e.g., blast processing) for removing the chill layer 300. In contrast to this, the above-described adhesive can favorably bond the case 2 and the hood portion 5 even if the chill layer 300 is included. For this reason, the connector-equipped case 1 can include the adhesive layer 6 without performing a surface treatment such as removing the chill layer 300. By omitting the above-described surface treatment, it is possible to reduce the number of steps. If the above-described processing is omitted, the region of the surface of the case 2 on which the adhesive layer 6 is formed will include the chill layer 300. That is, the fact that the chill layer 300 is present directly below the adhesive layer 6 is one piece of evidence indicating that the above-described surface treatment has been omitted.

2. Manufacturing Method

In the connector-equipped case 1 of the embodiment, the hood portion 5 and the core portion 4 need only be manufactured in a stepwise manner. For example, the connector-equipped case 1 may be manufactured using a manufacturing method including the following steps (see FIG. 4).

First Step

The case 2 including the through hole 22 and the core portion 4 supporting the multiple terminals 40 are prepared.

Second Step

The adhesive layer 60 is formed in a region in the range of the through hole 22 on the outer peripheral surface of the above-described case 2. The adhesive layer 60 is formed using adhesive containing acrylic rubber. Note that for ease of comprehension, the adhesive layer 60 is indicated by cross-hatching in FIG. 4.

Third Step

The resin composition is injection-molded in the region around the through hole 22 of the above-described case 2 in a state in which the above-described core portion 4 is arranged in the internal space of the above-described case 2 such that the end portions of the above-described terminals 40 face outward of the above-described case 2 via the through hole 22 of the above-described case 2. In this step, the hood portion 5 is formed, and a portion of the core portion 4 and the hood portion 5 are integrated. Also, in this step, the adhesive layer 60 is cured and the case 2 and the hood portion 5 are bonded using the adhesive layer 6.

Hereinafter, the steps will be described simply.

In the first step described above, the case 2 is manufactured using die casting, as described above. The core portion 4 is manufactured by performing injection molding (insert molding) on a member that supports the multiple terminals 40 in a predetermined aligned and bent state as described above.

In the above-described "second step", a half-cured adhesive layer 60 is formed. For example, a sheet member composed of the above-described specific adhesive may be arranged in the region around the above-described through hole 22, and thereafter may be heated to be put in the half-cured state.

In the above-described third step, for example, the resin composition is injection-molded from the outside of the case 2 on the outer peripheral surface of the case 2 to form the main body portion 50 and the outer flange portion 51 of the hood portion 5 on the outside of the case 2. Also, for example, the resin composition is injected from the outside of the case 2 into the case 2 through the through hole 22 of the case 2 to form the insertion portion 52, the inner flange portion 53, and the joining portion 54. The core portion 4 and the hood portion 5 are integrated by forming the joining portion 54. Furthermore, for example, by continuously injecting the resin composition from the outside of the case 2 into the case 2 through the through hole 22, an integrally molded object that is continuous from the main body portion 50 to the joining portion 54 is formed. Prior to the injection molding, the case 2 may also be pre-heated to about the same temperature as the mold for molding, for example. By pre-heating the case 2, the resin composition flows more easily. For this reason, the hood portion 5 is molded with high precision, and the hood portion 5 has excellent manufacturability. Heating for putting the above-described adhesive in a half-cured state may also be used in pre-heating.

Furthermore, the adhesive layer 6 is obtained by curing the half-cured adhesive layer 60 using the pressure and heat obtained during injection molding. The case 2 and the hood portion 5 are bonded by the cured adhesive layer 6.

2-1. Main Effects

The connector-equipped case 1 and the connector-equipped wire harness 10 of the embodiment include the adhesive layer 6 composed of an adhesive containing acrylic rubber. For this reason, even in a usage environment that is repeatedly subjected to a heat cycle and vibration, the state in which the case 2 and the hood portion 5 are bonded is maintained by the adhesive layer 6. That is, the state in which the case 2 and the connector portion 3 are integrated is maintained. Accordingly, the connector-equipped case 1 and the connector-equipped wire harness 10 can be arranged at a location near the engine, such as a location directly above the engine. When arranged directly above the engine or the like, the entire length L8 of the wire harness 8 can be reduced (e.g., less than 800 mm). As a result, the ECU 17 including the wire harness 8 is compact and lightweight. If the connector-equipped case 1, the connector-equipped wire harness 10, and the ECU 17 are installed on the engine of an automobile, the compact and lightweight ECU 17 contributes to an improvement in fuel efficiency.

3. Test Example 1

Bondability between a metal member and a resin molded body via an adhesive layer was checked by producing samples obtained by injection-molding resin compositions in metal members on which adhesive layers of various compositions were formed.

3-1. Production of Samples

Figure 6A:
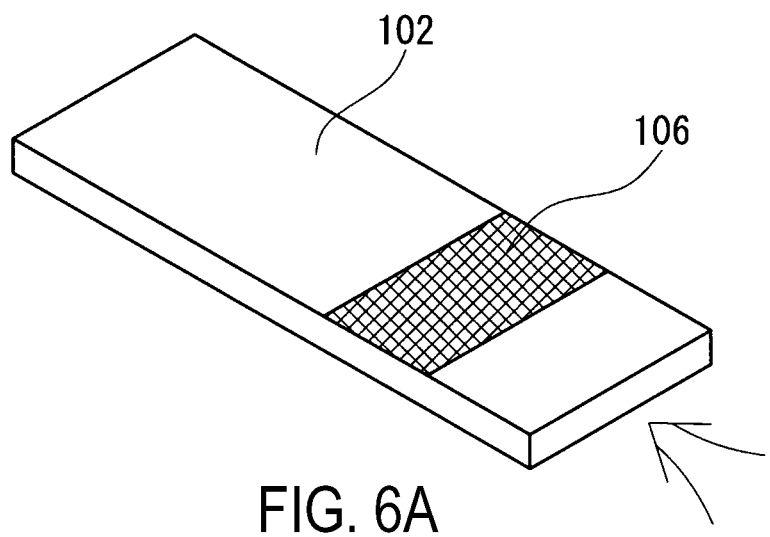
FIG. 6A is a diagram illustrating a test piece for a shear tension test, and shows a state prior to injection molding.
Figure 6B:
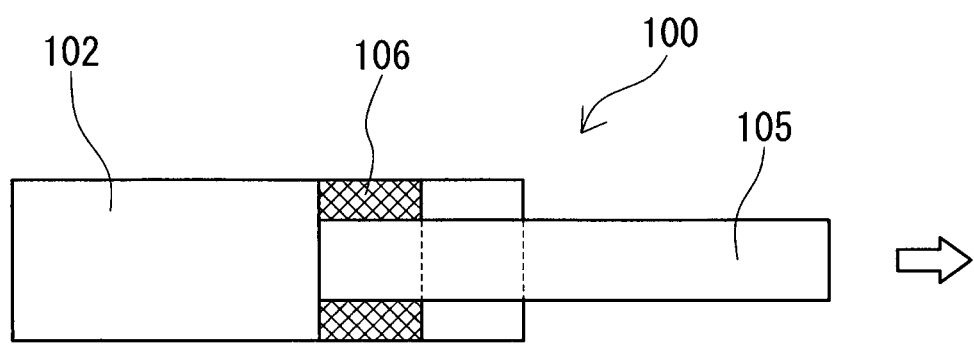
FIG. 6B is a plan view of a test piece for a shear tension test.
Figure 6C:
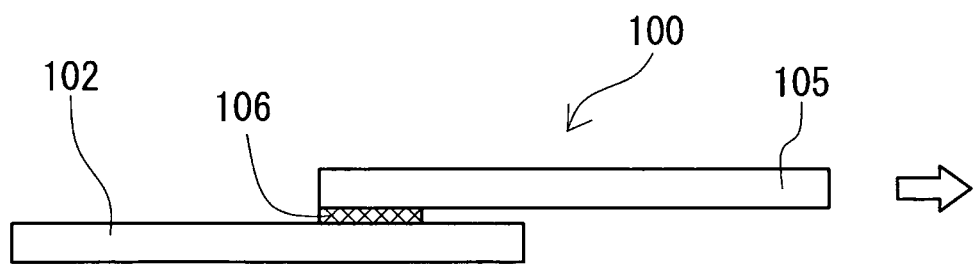
FIG. 6C is a side view of a test piece for a shear tension test.

In this test, as shown in FIGS. 6B and 6C, test pieces 100 including metal pieces 102, adhesive layers 106, and resin compositions 105 are produced. FIG. 6B shows a state in which the test pieces 100 are viewed in plan view from the thickness direction of the metal pieces 102. FIG. 6C shows a state in which the test piece 100 is viewed from the side from a direction orthogonal to the thickness direction of the metal piece 102 (or the direction in which the metal piece 102 and the resin molded body 105 are stacked). In FIGS. 6A to 6C, the adhesive layer 106 is indicated with cross-hatching to facilitate comprehension. Also, in FIG. 6C, the adhesive layer 106 is shown with a thickness that is greater than its actual thickness.

The metal piece 102 is a metal plate that is composed of ADC12 and was manufactured using die casting, and is a commercially-available item. ADC12 is an Al-based alloy that contains Si in an amount of 9.6 mass % to 12.0 mass %. The metal piece 102 is a rectangular board with a length of 50 mm, a width of 20 mm, and a thickness of 2 mm. One surface of the metal piece 102 is degreased with alcohol. Here, a surface treatment such as sandblasting is not performed. For this reason, the surface of the metal piece 102 and its vicinity include a chill layer. Note that observation of a cross section of the metal piece 102 through a microscope can be used to check the chill layer. A scanning electron microscope (SEM), a metal microscope, or the like can be used for this observation.

An adhesive layer 106 with a length of 10 mm, a width of 20 mm, and a thickness of 0.2 mm is formed on one surface of the above-described degreased metal piece 102, at a position located 10 mm away from one edge in the long-side direction (one short side edge) of the metal piece 102 (FIG. 6A). The adhesives used in the adhesive layer 106 are shown in Tables 1 to 3. After the adhesive is provided at a predetermined location through pasting, coating, or pressing, and thereafter pre-heating and the like are performed to form an uncured (includes half-cured) adhesive layer 106.

3-1-1. Adhesive Layer

The adhesives of samples No. 1 to No. 6 area adhesives whose main component is acrylic rubber. The glass-transition temperatures Tg (° C.) of the adhesives are shown in Table 1.

The adhesives of samples No. 1 to No. 6 are molded into the form of sheets and pasted on the above-described degreased metal pieces 102, and are thereafter pre-heated. The pre-heating conditions are a heating temperature of 130° C. or 150° C. and a heating time of 12 minutes or 14 minutes. The pre-heating conditions of the samples are shown in Table 1.

The adhesives of samples No. 11 to No. 20 are all commercially-available adhesives.

The main component of the adhesive of sample No. 11 is epichlorohydrin rubber. In Table 2, (*) is shown in "Main Component of Adhesive" (the same applies to later-described Table 4 as well). The glass-transition temperature Tg (° C.) of this adhesive is shown in Table 2.

The main component of the adhesives of samples No. 12 to No. 18 is silicone rubber.

The main component of the adhesives of samples No. 19 and No. 20 is polyester elastomer.

The adhesives of samples No. 11 and No. 15 to No. 18 are applied to the above-described degreased metal pieces 102 and are thereafter pre-heated. The pre-heating conditions are a heating temperature of 100° C. or 150° C. and a heating time of 15 minutes or 30 minutes. The pre-heating conditions are shown in Tables 2 and 3.

The adhesives of samples No. 12 to No. 14 are applied to the above-described degreased metal pieces 102, and are thereafter held at room temperature (RT, here about 20° C.) for 12 hours. These samples are not heated, but the above-described holding conditions are shown in the section "Pre-heating Conditions" in Table 2.

The adhesives of samples No. 19 and No. 20 are molded into the form of sheets and are pasted on the degreased metal pieces 102 through pressing. The pressing conditions are a heating temperature of 230° C., a pressure of 2 MPa, a heating time of 1 minute, and a cooling time of 1 minute. A commercially-available desktop press is used for pressing.

3-1-2. Resin Molded Body

The resin molded body 105 is formed through injection molding (insert molding) so as to overlap with the above-described adhesive layer 106 (see the arrow in FIG. 6A). The resin molded body 105 is a rectangular plate with a length of 50 mm, a width of 10 mm, and a thickness of 2 mm. The resin molded body 105 is formed on the metal piece 102 (FIG. 6C) such that the one edge (one short side edge) of the resin molded body 105 overlaps the edge of the adhesive layer 106 (FIG. 6B). The test piece 100 is formed by stacking the metal piece 102, the adhesive layer 106, and the resin molded body 105 in the stated order. One end of the stacked body is constituted by one end portion of the metal piece 102. The other end of the above-described stacked body is constituted by the other end portion of the resin molded body 105. Common conditions that are used for injection molding of PBT or the like can be used as the conditions for injection molding of all of the resin compositions of the samples. Note that the resin compositions of the samples are sufficiently dried in the state prior to injection molding, and are then used in injection molding.

The resin compositions of the samples other than sample No. 3 are commercially-available items containing PBT, and have conventionally been used as constituent materials of connectors. The resin composition contains PBT and polycarbonate (PC) and contains glass fibers and glass flakes as fillers. The content of the filler is 40 parts by mass, relative to 100 parts by mass of the resin composition. The above-described resin composition does not contain PET, an elastomer, or epoxy resin. Table 1 shows the above-described resin composition as PBT+PC.

The resin composition of sample No. 3 contains PBT and PET. Also, the resin composition contains glass fibers and glass flakes as fillers, and contains an elastomer and epoxy resin. This resin composition is used after being sufficiently mixed. Table 1 shows the above-described resin composition as PBT+PET. Note that the epoxy resin may also be omitted.

The content of the PBT is 233 parts by mass relative to 100 parts by mass of PET. The total content of PBT and PET is 50 parts by mass or more relative to 100 parts by mass of the resin composition.

The content of the filler is 40 parts by mass relative to 100 parts by mass of the resin composition. The mass ratio of the glass fibers and the glass flakes is glass fibers:glass flakes=6:4.

The content of the elastomer is 10 parts by mass relative to 100 parts by mass of the resin composition.

The content of the epoxy resin is 5 parts by mass relative to 100 parts by mass of the resin composition.

The resin molded body composed of the resin composition of sample No. 3 has a sea-island structure including a sea portion that mainly contains PBT and island portions that mainly contains PET. In a manner of speaking, the PET is evenly dispersed in the PBT. An atomic force microscope (AFM), a transmission electron microscope (TEM), or the like can be used to check the phase structure of the resin molded body. For example, an energy-dispersion X-ray analysis apparatus (TEM-EDX) included in a TEM can be used for component analysis of the sea portion and the island portions. The content of the above-described fillers in the above-described resin molded body can be measured by, for example, heating the resin molded body to volatilize and remove the resin component and the like, and extracting the above-described fillers.

Also, for example, nuclear magnetic resonance spectrometry (NMR) can be used for component analysis, such as component analysis of the adhesive layer, measurement of the content of PBT in the resin molded body, and analysis of whether or not an elastomer is included. The composition of the adhesive layer and the composition of the resin molded body substantially maintain the compositions of the adhesive and the resin composition used in the raw material.

3-2. Success of Adhesion Through Insert Molding

In the produced test pieces 100, it was checked whether or not the metal piece 102 and the resin molded body 105 were adhered to each other via the adhesive layer 106. A sample in which adherence was successful is evaluated as "G", a sample in which adherence failed is evaluated as "B", and the evaluation results are shown in Tables 1 to 3.

3-3. Shear Tension Test

A shear tension test is performed on the test pieces 100 in which the metal pieces 102 and the resin molded bodies 105 are adhered via the adhesive layers 106 through insert molding. Here, after the injection molding is performed, the test pieces 100 are left to sit for one day at room temperature (here, about 20° C.), and thereafter, a test is performed using an autograph including a commercially-available thermostatic chamber. The test conditions are shown below.

Test environment: −40° C. (low temperature), 125° C. (high temperature)

Tension speed: 10 mm/min

Measurement number (N number): N=5 in each test environment.

Here, in the above-described test environment, the fracture morphology of the test pieces 100 is checked. In the case of cohesive fracture or base material fracture, the fracture morphology is evaluated as "G", and in the case of interfacial fracture, the fracture morphology is evaluated as "B". If interfacial fracture occurs in at least 1 out of 5 instances of measurement, the fracture morphology is evaluated as "B". The evaluation results are shown in Table 1. Also, in the above-described test environment, the shear strain (%) is obtained for each test piece 100, and an average value of 5 instances is further obtained.

The shear strain (%) of the adhesive layer 106 is obtained using [(displacement amount during fracture)/(thickness $t_0$ (mm) of adhesive layer 106 before test)]×100. The displacement amount (mm) during fracture in this context is the distance by which the end portion of the resin molded body 105 moves from the position prior to the test until fracturing.

A commercially-available adhesive is used as sample No. 11, and a resin composition that is conventionally used as a constituent material of a connector is used as sample No. 11, and thus sample No. 11 can be called a reference sample. In view of this, relative values of the shear strain of the test samples are shown in Tables 1 to 3 with the shear strain of sample No. 11 set to a reference value (1.00). If the relative value exceeds 1, the shear strain is greater than in sample No. 8, and thus it can be said that that test piece 100 can favorably adhere the metal piece 102 and the resin molded body 105 using the adhesive layer 106.

TABLE 1

| Sample No. | | 1 | 2 | 3 | 4 | 5 | 6 |
|---|---|---|---|---|---|---|---|
| Main component of adhesive | | Acrylic rubber | Acrylic rubber | Acrylic rubber | Acrylic rubber | Acrylic rubber | Acrylic rubber |
| Adhesive Tg(° C.) | | 38 | −10 | −10 | −20 | −30 | −40 |
| Formation method | | Pasting | Pasting | Pasting | Pasting | Pasting | Pasting |
| Pre-heating conditions | Temperature (° C.) | 150 | 150 | 150 | 130 | 130 | 130 |
| | Time | 12 minutes | 12 minutes | 12 minutes | 14 minutes | 14 minutes | 14 minutes |
| Resin composition | | PBT + PC | PBT + PC | PBT + PET | PBT + PC | PBT + PC | PBT + PC |
| Adhesion in insert molding | | G | G | G | G | B | B |
| Fracture morphology | −40° C. | B | G | G | B | — | — |
| | 125° C. | G | G | G | G | — | — |

TABLE 1-continued

| Sample No. | | 1 | 2 | 3 | 4 | 5 | 6 |
|---|---|---|---|---|---|---|---|
| Shear strain | −40° C. | 0.72 | 1.68 | 2.55 | 1.10 | — | — |
| | 125° C. | 1.32 | 1.60 | 2.46 | 0.87 | — | — |

TABLE 2

| Sample No. | | 11 | 12 | 13 | 14 | 15 |
|---|---|---|---|---|---|---|
| Main component of adhesive | | (*) | Silicone rubber | Silicone rubber | Silicone rubber | Silicone rubber |
| Adhesive Tg(° C.) | | −21 | — | — | — | — |
| Formation method | | Coating | Coating | Coating | Coating | Coating |
| Pre-heating conditions | Temperature (° C.) | 150 | RT | RT | RT | 150 |
| | Time | 30 minutes | 12 hours | 12 hours | 12 hours | 15 minutes |
| Resin composition | | PBT + PC | PBT + PC | PBT + PC | PBT + PC | PBT + PC |
| Adhesion in insert molding | | G | B | B | B | B |
| Fracture morphology | −40° C. | B | — | — | — | — |
| | 125° C. | G | — | — | — | — |
| Shear strain | −40° C. | 1.00 | — | — | — | — |
| | 125° C. | 1.00 | — | — | — | — |

TABLE 3

| Sample No. | | 16 | 17 | 18 | 19 | 20 |
|---|---|---|---|---|---|---|
| Main component of adhesive | | Silicone rubber | Silicone rubber | Silicone rubber | Polyester elastomer | Polyester elastomer |
| Adhesive Tg(° C.) | | — | — | — | — | — |
| Formation method | | Coating | Coating | Coating | Pressing | Pressing |
| Pre-heating Conditions | Temperature (° C.) | 150 | 150 | 100 | | |
| | Time | 30 minutes | 30 minutes | 30 minutes | | |
| Resin composition | | PBT + PC | PBT + PC | PBT + PC | PBT + PC | PBT + PC |
| Adhesion in insert molding | | B | B | B | G | B |
| Fracture morphology | −40° C. | — | — | — | B | — |
| | 125° C. | — | — | — | B | — |
| Shear strain | −40° C. | — | — | — | 3.68 | — |
| | 125° C. | — | — | — | 3.06 | — |

Upon comparing Table 1 and Tables 2 and 3, it is understood that with the adhesives containing acrylic rubber, an adhesive layer with excellent bondability with a metal piece and a resin molded body is likely to be obtained even if surface processing for removing a chill layer is not performed on the metal piece. This is demonstrated by, for example, the fact that samples No. 2 and No. 3, whose fracture morphology is a cohesive fracture or base material fracture are included, and the fact that samples No. 2 and No. 3, whose shear strain is greater than that of sample No. 11, are included. Also, it is understood that with the adhesives containing acrylic rubber, an adhesive layer that can bond with a metal piece and a resin molded body using the pressure and heat obtained during insert molding is likely to be obtained. This is demonstrated by, for example, the fact that samples No. 1 to No. 4, for which the evaluation of adhesion in insert molding is G, are included.

In particular, in samples No. 2 and No. 3, the fracture morphology is a cohesive fracture or base material fracture at both a low temperature and a high temperature, and the shear strain is greater compared to that of sample No. 11. Because of this, it can be said that in samples No. 2 and No. 3, the metal piece and the resin molded body can be more favorably bonded by the adhesive layer, compared to the case of using a resin composition that is commonly used in a connector and a commercially-available adhesive. In particular, in this test, it can be said that if the condition that the glass-transition temperature of the adhesive is greater than −20° C. and less than 38° C. is satisfied, a more excellent bondability with the metal piece and the resin molded body is achieved by the adhesive layer. Furthermore, it is understood that if a resin molded body composed of a resin composition containing PBT and PET is used, the shear strain of the adhesive will be greater (compare and refer to samples No. 2 and No. 3). Because of this, it can be said that an adhesive containing acrylic rubber has more excellent bondability with a resin composition containing PBT and PET. Note that the shear strain of samples No. 2 and No. 3 satisfies a property that is generally desirable in a vehicle-mounted component.

4. Test Example 2

Samples in which resin compositions were injection-molded on metal plates on which adhesive layers of various compositions were formed were produced, and the sealability of the adhesive layers were examined.

4-1. Production of Samples

Figure 7:
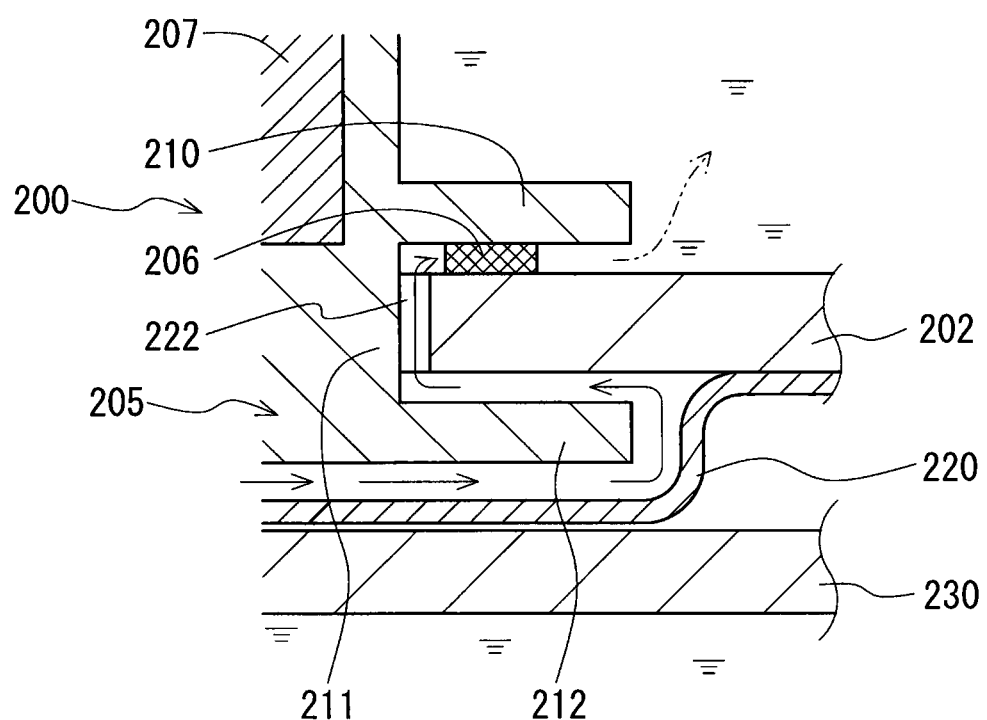
FIG. 7 is a diagram illustrating a test method for an air leak test.

In this test, a test member 200 including a metal plate 202, a resin molded body 205, and an adhesive layer 206 is produced as shown in FIG. 7.

The metal plate 202 in this context is a die-cast member composed of commercially-available ADC12, similarly to that of Test Example 1. The metal plate 202 is a rectangular plate with a length of 190 mm, a width of 90 mm, and a thickness of 3.5 mm. The test member 200 is produced by providing a through hole 222 in the metal plate 202 and injection-molding the resin molded body 205 so as to be continuous inside and outside of the through hole 222. The metal plate 202 is the side plate 21 of the case 2 shown in FIG. 3, and imitates a location having a through hole 22. Note that FIG. 7 shows an enlarged view of only a portion of the through hole 222 in the metal plate 202 and a region nearby in a cross section obtained by cutting the test member 200 with a plane parallel to the thickness direction of the metal plate 202. Also, the gaps between the members are shown exaggerated in FIG. 7 in order to facilitate comprehension. The above-described gap is inevitably provided. The size of the gap is such that air or water molecules can pass through. If the adhesive layer 206 has excellent sealability, the test member 200 will have excellent sealability even if the gap is included.

One surface (the upper surface in FIG. 7) of the metal plate 202 is degreased with alcohol. Here, a surface treatment such as sandblasting is not performed. The adhesive is applied to the region around the through hole 222 on the one surface of the degreased metal plate 202, and thereafter pre-heating is performed to form a half-cured adhesive layer. The core member 207 is arranged on the one surface side of the metal plate 202 including the half-cured adhesive layer. Here, the core member 207 is arranged so as to extend upward in FIG. 7 from the one surface side of the metal plate 202. In this state, the resin composition is injection-molded (insert-molded) from one surface of the metal plate 202 to produce the resin molded body 205. In this test, the metal plate 202 including the above-described half-cured adhesive layer is pre-heated to 80° C. and subjected to injection molding. The core member 207 is a cuboid resin molded body imitating the core portion 4 shown in FIG. 1 and the like. The resin composition forming the core member 207 is the same as the resin composition used in insert molding. Note that the resin compositions of the samples are sufficiently dried in the state prior to injection molding, and are then used in injection molding.

The resin composition 205 imitates the hood portion 5 shown in FIG. 3 and is formed as follows. A ring-shaped flange portion 210 and a portion covering the core member 207 are formed on one surface of the metal plate 202. The core member 207 is arranged such that the one end surface of the core member 207 faces the through hole 222. The insertion portion 211 is formed in the through hole 222. A flat plate-shaped portion 212 is formed on the other surface (the lower surface in FIG. 7) side of the metal plate 202. The plate-shaped portion 212 is continuous with the insertion portion 211, covers the one end surface of the core member 207, and seals the through hole 222. The region on the outer edge side of the plate-shaped portion 212 covers the region around the through hole 222 on the other side of the metal plate 202. That is, the region on the outer edge side of the plate-shaped portion 212 and the flange portion 210 are provided so as to sandwich the metal plate 202. Due to the other surface side of the metal plate 202 being flat, the later-described sheet member 220 composed of silicone rubber is easily brought into areal contact with the other surface side of the test member 200. The outline of the flange portion 210 is a rectangular frame shape.

The adhesive layer 206 is interposed between the flange portion 210 of the produced resin molded body and one surface of the metal plate 202. The thickness of the adhesive layer 206 is 0.2 mm. If a test member 200 is used in which the metal plate 202 and the resin molded body 205 are favorably bonded by the adhesive layer 206 and the adhesive layer 206 has excellent sealability, air leakage does not occur between the one surface and the other surface of the metal plate 202 when a later-described air leak test is performed. For example, as indicated by the thin-line arrow shown in FIG. 7, even if air is blown from the other surface (the lower surface in FIG. 7) side of the metal plate 202 to the one surface (upper surface in FIG. 7) side, the air does not escape to the one surface side of the metal plate 202. On the other hand, if a test member 200 is used in which the bond achieved by the adhesive layer 206 is insufficient and the adhesive layer 206 has inferior sealability, the air blown from the other surface side of the metal plate 202 will leak from the one surface side of the metal plate 202 as indicated by the one-dot chain line arrow in FIG. 7.

The adhesives and resin compositions of samples No. 2-1 to 2-4 of Test Example 2 are the same as those of samples No. 1 to No. 4 of Test Example 1. The resin composition of the adhesive of sample No. 2-11 of Test Example 2 is the same as that of sample No. 11 of Test Example 1 (main component of the adhesive: epichlorohydrin rubber). The formation method, the pre-heating conditions, the injection molding conditions, and the like for the adhesive layer of Test Example 2 are similar to those of Test Example 1. The main components of the adhesives, the pre-heating conditions, and the resin compositions are shown in Table 4.

4-2. Air Leak Test

An air leak test was performed on the test members 200 of the produced samples using a commercially-available air-pulse dispenser (ML-808GX manufactured by Musashi Engineering, Inc.).

Here, after injection molding is performed, one day or more passed with the temperature held at room temperature (here, about 20° C.), and thereafter the test was performed. In the test, air is blown from the other surface side of the metal plate 202 on the test members 200 of the samples, and it is visually checked whether or not air bubbles are formed from one surface side (the side having the adhesive layer 206) of the metal plate 202.

A sheet member 220 composed of silicone rubber is attached to the test member 200 of each sample so as to cover the other surface side of the metal plate 202. An air hose (not shown) is connected to the sheet member 220. The sheet member 220 is attached to the test member 200 in order to prevent air from the air hose from leaking from the other surface side to the periphery of the metal plate 202. The test member 200 including the sheet member 220 is fixed with a jig 230 and immersed in water. The test member 200 is arranged in the water such that the one surface side of the metal plate 202 faces upward and the other surface side faces downward. In this arrangement state, air is inserted from an air hose. The air is sent between the sheet member 220 and the other surface of the metal plate 202, and furthermore flows toward the adhesive layer 206 through the gap between the metal plate 202 and the plate-shaped portion 212 and the gap between the through hole 222 and the insertion portion 211, as indicated by the thin-line arrow shown in FIG. 7. The insertion pressure of the air is changed, and it is checked whether or not the air passes from the other surface side of the metal plate 202 to the one surface side and air bubbles are emitted from the one surface side into the water. The injection pressure is selected from a range of 50 kPa to 200 kPa. If air bubbles are not emitted, the test member 200 is evaluated as "G", and if air bubbles are formed, the test member 200 is evaluated as "B". The evaluation results are shown in Table 4.

TABLE 4

| Sample No. | | 2-1 | 2-2 | 2-3 | 2-4 | 2-11 |
|---|---|---|---|---|---|---|
| Main component of adhesive | | Acrylic rubber | Acrylic rubber | Acrylic rubber | Acrylic rubber | (*) |
| Adhesive Tg (° C.) | | 38 | −10 | −10 | −20 | −21 |
| Pre-heating conditions | Temperature (° C.) | 150 | 150 | 150 | 130 | 150 |
| | Time | 12 minutes | 12 minutes | 12 minutes | 14 minutes | 30 minutes |
| Resin composition | | PBT + PC | PBT + PC | PBT + PET | PBT + PC | PBT + PC |
| Air leak test | 50 kPa | G | G | G | G | G |
| | 100 kPa | G | G | G | G | G |
| | 150 kPa | B | G | G | G | G |
| | 200 kPa | B | G | G | G | G |

As shown in Table 4, it is understood that with the adhesives containing acrylic rubber, an adhesive with excellent sealability is likely to be obtained. In particular, it is understood that even if the injection pressure is 200 kPa, air bubbles are not formed in samples No. 2-2 and No. 2-3 and excellent sealability is achieved.

Based on the above-described Test Examples 1 and 2, it is indicated that the adhesive containing acrylic rubber can favorably bond the metal and the resin molded body even in a usage environment that is subjected to a heat cycle. It can be said that this kind of adhesive can be suitably used in a member including metal and a resin molded body such as the connector-equipped case of the embodiment, which is an application in which the member is arranged at a location near an engine, such as a location directly above the engine. Also, based on the above-described Test Examples 1 and 2, it is indicated that the above-described adhesive can favorably bond the metal and the resin molded body even if a surface treatment such as removal of a chill layer is not performed. Furthermore, it was indicated that the above-described adhesive can favorably bond the metal and the resin molded body using the pressure and heat obtained during insertion molding.

The present disclosure is not limited to these illustrative examples. For example, in the above-described Test Examples 1 and 2, the composition (PBT content, type and content of filler, etc.), structure, and the like of the resin composition, the composition of the metal, and the composition of the adhesive can be changed.

What is claimed is:

1. A connector-equipped case comprising:
   a case composed of a case material and including a through hole;
   a connector fixed to the case, the connector including:
     a core that supports a plurality of terminals; and
     a hood having one piece that contacts the core and the through hole;
   an adhesive layer interposed between the case and the hood; and
   a chill layer inside the case material in a region of a surface of the case where the adhesive layer is disposed,
   wherein a constituent material of the adhesive layer is an adhesive that contains acrylic rubber,
   a glass-transition temperature of the adhesive is greater than −20° C. and less than 38° C., and
   a constituent material of the hood is a resin composition containing polybutylene terephthalate and polyethylene terephthalate.

2. The connector-equipped case according to claim 1, wherein a thickness of the adhesive layer is 0.1 mm or more and 0.5 mm or less.

3. The connector-equipped case according to claim 1, wherein the case is a die-cast member.

4. The connector-equipped case according to claim 3, wherein the case material is an aluminum-based alloy.

5. The connector-equipped case according to claim 4, wherein the aluminum-based alloy contains Si in an amount of 1 mass % or more and 30 mass % or less.

6. The connector-equipped case according to claim 1, wherein the case includes a fixing piece that is used for attachment to an engine.

7. The connector-equipped case according to claim 1, wherein the connector-equipped case is attached directly above an engine.

8. The connector-equipped case according to claim 1, wherein a circuit board connected to ends on one side of the terminals performs control of at least one of fuel injection of an engine and ignition of the engine.

9. The connector-equipped case according to claim 6, wherein the engine is of an automobile.

10. A connector-equipped wire harness comprising:
    the connector-equipped case according to claim 1; and
    a wire harness connected to ends of the terminals,
    wherein an overall length of the wire harness is less than 800 mm.

11. An engine control unit comprising:
    the connector-equipped case according to claim 1; and
    a circuit board stored in the case and connected to ends on one side of the terminals.

* * * * *